(12) United States Patent
Barth et al.

(10) Patent No.: US 8,999,756 B2
(45) Date of Patent: Apr. 7, 2015

(54) METHOD AND APPARATUS FOR SEMICONDUCTOR DEVICE FABRICATION USING A RECONSTITUTED WAFER

(71) Applicant: Infineon Technologies AG, Neubiberg (DE)

(72) Inventors: Hans-Joachim Barth, Munich (DE); Matthias Hierlemann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/286,527

(22) Filed: May 23, 2014

(65) Prior Publication Data

US 2014/0335654 A1   Nov. 13, 2014

Related U.S. Application Data

(62) Division of application No. 12/604,153, filed on Oct. 22, 2009, now Pat. No. 8,772,087.

(51) Int. Cl.
*H01L 21/56* (2006.01)
*H01L 23/31* (2006.01)
(Continued)

(52) U.S. Cl.
CPC ............ *H01L 21/565* (2013.01); *H01L 21/568* (2013.01); *H01L 21/6835* (2013.01); *H01L 23/13* (2013.01); *H01L 23/3107* (2013.01); *H01L 23/49816* (2013.01); *H01L 23/5389* (2013.01); *H01L 24/19* (2013.01); *H01L 24/20* (2013.01); *H01L 24/96* (2013.01); *H01L 24/97* (2013.01); *H01L 25/0655* (2013.01); *H01L 2224/04105* (2013.01); *H01L 2224/20* (2013.01); *H01L 2224/97* (2013.01); *H01L 2924/01013* (2013.01); *H01L 2924/01029* (2013.01); *H01L 2924/01033* (2013.01); *H01L 2924/0104* (2013.01); *H01L 2924/01042* (2013.01); *H01L 2924/01046* (2013.01); *H01L 2924/01047* (2013.01); *H01L 2924/01051* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/04953* (2013.01); *H01L 2924/10329* (2013.01); *H01L 2924/14* (2013.01); *H01L 2924/01005* (2013.01); *H01L 2924/01006* (2013.01); *H01L 2924/01019* (2013.01); *H01L 2924/01023* (2013.01);
(Continued)

(58) Field of Classification Search
USPC ............ 438/106, 110; 257/E23.178, E21.502
See application file for complete search history.

(56) References Cited

U.S. PATENT DOCUMENTS 4,076,567 A   2/1978   Yoshikawa et al.
5,232,651 A   8/1993   Okuno et al.
(Continued)

FOREIGN PATENT DOCUMENTS

WO   WO 2008155231 A1 * 12/2008

*Primary Examiner* — Marvin Payen
*Assistant Examiner* — Jeremy Joy
(74) *Attorney, Agent, or Firm* — Slater & Matsil, L.L.P.

(57) ABSTRACT

Method and apparatus for semiconductor device fabrication using a reconstituted wafer is described. In one embodiment, diced semiconductor chips are placed within openings on a frame. A reconstituted wafer is formed by filling a mold compound into the openings. The mold compound is formed around the chips. Finished dies are formed within the reconstituted wafer. The finished dies are separated from the frame.

23 Claims, 7 Drawing Sheets

(51) Int. Cl.
*H01L 21/683* (2006.01)
*H01L 23/13* (2006.01)
*H01L 23/538* (2006.01)
*H01L 23/00* (2006.01)
*H01L 25/065* (2006.01)
*H01L 23/498* (2006.01)

(52) U.S. Cl.
CPC .............. *H01L 2924/01024* (2013.01); *H01L 2924/01044* (2013.01); *H01L 2924/01072* (2013.01); *H01L 2924/014* (2013.01); *H01L 2924/18162* (2013.01); *H01L 21/561* (2013.01)

(56) References Cited

U.S. PATENT DOCUMENTS

| | | | |
|---|---|---|---|
| 5,389,176 A | 2/1995 | Nakanishi et al. | |
| 6,734,534 B1 * | 5/2004 | Vu et al. | 257/668 |
| 7,442,581 B2 | 10/2008 | Lytle et al. | |
| 8,169,072 B2 * | 5/2012 | Uchiyama et al. | 257/700 |
| 2001/0016400 A1 * | 8/2001 | Lee | 438/458 |
| 2002/0020898 A1 * | 2/2002 | Vu et al. | 257/676 |
| 2002/0137263 A1 * | 9/2002 | Towle et al. | 438/127 |
| 2002/0185303 A1 * | 12/2002 | Takeuchi et al. | 174/256 |
| 2003/0068852 A1 | 4/2003 | Towle et al. | |
| 2005/0202590 A1 * | 9/2005 | Huang et al. | 438/106 |
| 2005/0285244 A1 * | 12/2005 | Chen | 257/678 |
| 2006/0095413 A1 * | 5/2006 | Moffat et al. | 707/3 |
| 2008/0157312 A1 | 7/2008 | Yang et al. | |
| 2008/0248614 A1 | 10/2008 | Yang et al. | |
| 2009/0140394 A1 | 6/2009 | Bathan et al. | |
| 2009/0203170 A1 | 8/2009 | Nakatani et al. | |
| 2010/0013081 A1 * | 1/2010 | Toh et al. | 257/692 |
| 2010/0047567 A1 * | 2/2010 | Souriau | 428/339 |
| 2010/0195299 A1 * | 8/2010 | Souriau et al. | 361/760 |

* cited by examiner

METHOD AND APPARATUS FOR SEMICONDUCTOR DEVICE FABRICATION USING A RECONSTITUTED WAFER

This application is a divisional of U.S. application Ser. No. 12/604,153, filed on Oct. 22, 2009, which application is hereby incorporated herein by reference.

TECHNICAL FIELD

The present invention relates generally to semiconductor devices, and more particularly to method and apparatus for semiconductor device fabrication using reconstituted wafers.

BACKGROUND

Wafer-Level Packaging (WLP) refers to the technology of packaging an integrated circuit at wafer level, instead of the traditional process of assembling the package of each individual unit after wafer dicing. WLP is closest to being a true chip-scale packaging (CSP) technology. Wafer-level packaging integrates wafer fabrication, packaging, test, and burn-in at wafer level, and streamlines the manufacturing process. Wafer-level packaging extends the wafer fabrication processes to include device interconnection and device protection processes. The use of WLP has dramatically grown as a result of its advantages in size, performance, flexibility, reliability, and cost over other packaging methods.

One of the challenges with WLP arises from the limitation of number of contacts and/or the contact area. Methods to overcome these limitations result in increased production costs and/or poor reliability and yield loss. Hence, what are needed are methods and apparatus for flip chip packaging that is not only cost effective but allows for improved contact formation.

SUMMARY OF THE INVENTION

These and other problems are generally solved or circumvented, and technical advantages are generally achieved, by illustrative embodiments of the present invention.

Embodiments of the invention include methods and apparatuses for semiconductor device fabrication using reconstituted wafers. In accordance with an embodiment of the present invention, a method for fabricating a semiconductor device comprises placing diced semiconductor chips within openings disposed on a frame. A reconstituted wafer is formed by filling a mold compound into the openings, the mold compound being formed around the chips. Finished dies are formed within the reconstituted wafer. The finished dies are separated from the frame.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1C illustrate a ball grid array package illustrating a reconstituted wafer before separation into individual integrated circuits after completion of processing in accordance with an embodiment of the invention, wherein FIG. 1A illustrates a top view and FIG. 1B illustrates a cross sectional view along line 1B of FIG. 1A and FIG. 1C illustrates a cross sectional view along line 1C of FIG. 1A and illustrates multiple chips disposed within a single opening;

FIGS. 3A and 3B illustrate an embodiment of fabricating the wafer level package during manufacturing, wherein FIG. 3A illustrates a top view and FIG. 3B illustrates a cross-sectional view during fabrication;

FIGS. 4A and 4B illustrate an embodiment of fabricating the wafer level package in during a next stage of manufacturing, wherein FIG. 4A illustrates a top view and FIG. 4B illustrates a cross-sectional view during fabrication;

FIGS. 8A-8C illustrate a reconstituted wafer during processing in accordance with an embodiment of the invention, wherein FIG. 8A illustrates a top view and FIG. 8B illustrates a corresponding cross sectional view during an intermediate state of wafer level processing, and FIG. 8C illustrates a cross sectional view after completion of wafer level packaging processes;

FIGS. 11A and 11B illustrate a ball grid array package illustrating a prior art reconstituted wafer before separation into individual integrated circuits after completion of processing, wherein FIG. 11A illustrates a top view and FIG. 11B illustrates a cross sectional view along line 11B of FIG. 11A.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
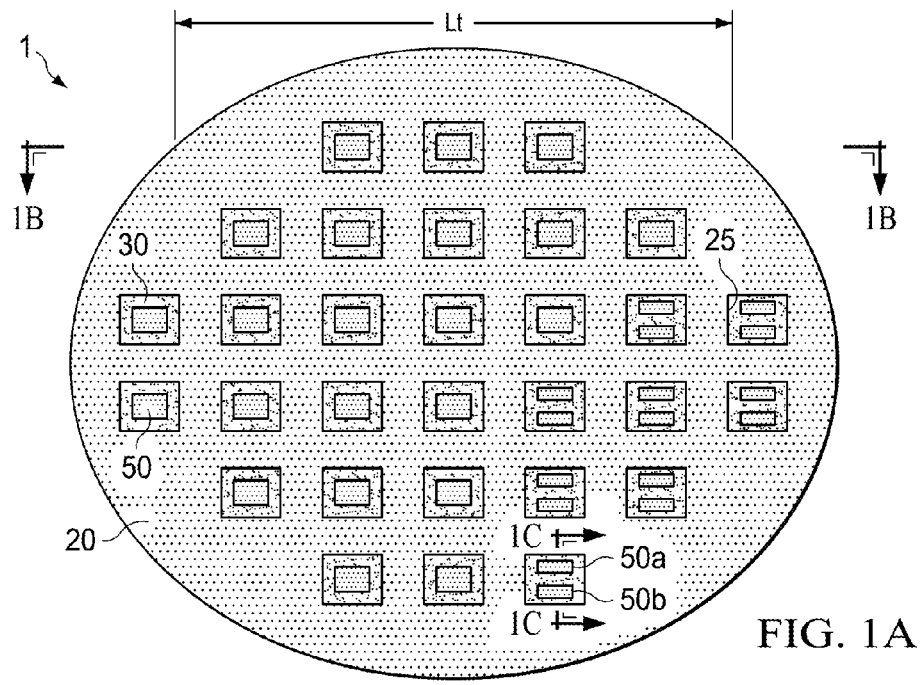

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely wafer level packaging. The invention may also be applied, however, to other types of packaging technologies.

Wafer level package (WLP) is a promising solution for high-speed packaging needs. Because the length of the interconnection lines on the WLP is limited to die size, the WLP has a minimum number of electrical parasitic elements. In Wafer-Level Packaging (WLP), an integrated circuit is packaged at wafer level, instead of the traditional process of assembling the package of each individual unit after wafer dicing. WLP is a true chip-scale packaging technology, as the resulting package is about the same size as the die. By extending the wafer fab processes to include device interconnection and device protection processes, wafer-level packaging integrates wafer fab processes with packaging and possibly test and burn-in at wafer level, streamlining and reducing manufacturing costs.

In WLP, redistribution lines on the WLP connect the on-chip pads to bump pads used for placing solder balls. These redistribution lines are formed using standard photolithography and thin film deposition techniques employed in the device fabrication itself. This additional level of interconnection redistributes the peripheral bonding pads of each chip to an area array of bump pads that are evenly deployed over the chip's surface. The solder balls or bumps used in connecting the device to the application circuit board are subsequently placed over these bump pads. In some embodiments, these bump pads consist of copper or copper alloy. In other embodiments, these bump pads comprise aluminum or aluminum alloy or any other suitable metal. In other embodiments, these bump pads may have an under bump metallization (UBM) between the pad metal and the solder balls. The UBM separating the pad metal from the solder balls may consist of different materials or material combinations. In some embodiments, the UBM comprises Ni, Au, Cu, V, Cr, Mo, Pd, W, Ti, TiN, TiW or any combination like Ni/Au, Ni/Pd, Ni/Pd/Au, Ti/Cu, TiW/Cu, TiN/Cu, Ti/Ni/V, Cr/Cu, or any other combination. Aside from providing the WLP's means of external connection, this redistribution technique also improves chip reliability by allowing the use of larger and more robust balls for interconnection and better thermal management of the device's I/O system.

Fan-in WLP refers to standard wafer level packaging wherein the package area is about the same as the chip area. Hence, the packaging is limited by the number of input/output connections. In a fan-out WLP, the packaging includes additional space surrounding the chip area for forming additional input/output (I/O) connections. The additional space enables forming WLP bump pads for connecting to the circuitry of the chip.

In conventional fan-out WLP, after completion of front end and back end processing, the wafer is diced to form individual chips. These diced chips are arranged on an adhesive tape, which is disposed on a carrier, while maintaining a predetermined separation between the chips. This predetermined separation is larger than the separation between the chips on the wafer. Typically, but not necessarily, the glued chips on the adhesive tape are arranged in a circular manner emulating the shape of a wafer. A mold compound or epoxy compound is poured to fill in the gaps between the chips. The mold compound is cured, for example, by annealing to form a reconfigured wafer or a reconstituted wafer comprising the mold compound and the individual chips. The reconfigured wafer is separated from the adhesive tape and subsequent processing follows to form redistribution lines, solder balls, etc.

One of the challenges with this technology arises from the difference in thermal expansion coefficient between the individual chips and the mold compound. While coefficients of thermal expansion of silicon based chips is less than about 2 ppm/° C., mold compounds typically have much higher thermal expansion coefficient, e.g., greater than 10 ppm/° C. Hence, during subsequent processing which require thermal cycling, stresses build up within the reconstituted wafer. The stress within the reconstituted wafer causes the reconstituted wafer to bow.

In particular, thermal treatment during curing of the dielectrics (mold compound, polyimides, WPR, etc.) results in bowing and warpage of the reconstituted wafers. For example, for 200 mm wafers, this bowing and warpage can be several millimeters from center to edge of the wafer. For 300 mm wafers, the problem is even worse.

Compared to typical silicon wafer, the bowing and warpage of the reconstituted wafers are much higher and result in handling problems in automated manufacturing equipment, alignment problems, non-uniform layer thicknesses and non-uniform electrical coupling during plasma processes. These problems subsequently manifest as reduced product yield and/or devices with poor reliability.

One way to solve the above problem is to introduce flattening steps. These flattening steps are performed by heating up the wafers followed by a fast cool down and thereby temporarily freezing the planarity of the reconstituted wafer. However, any subsequent thermal processing after the flattening step increases the bowing and warpage and requires another flattening step.

In addition, during the curing of the mold in order to form the reconstituted wafer, the mold material shrinks and may shift the individual dies out of their original location after die placement. This unwanted effect is called "die shift" and may result in yield problems because of misalignment of subsequent lithography steps with respect to the shifted dies.

In various embodiments, the present invention overcomes these and other limitations in a cost effective way by providing a reusable frame for forming a reconstituted wafer. After processing, the frame is reused for subsequent processing. In various embodiments, the use of a frame reduces the volume fraction of the mold compound in the reconstituted wafer, thus directly reducing the residual stress build up within the reconstituted wafer during subsequent processing.

Figure 1B:
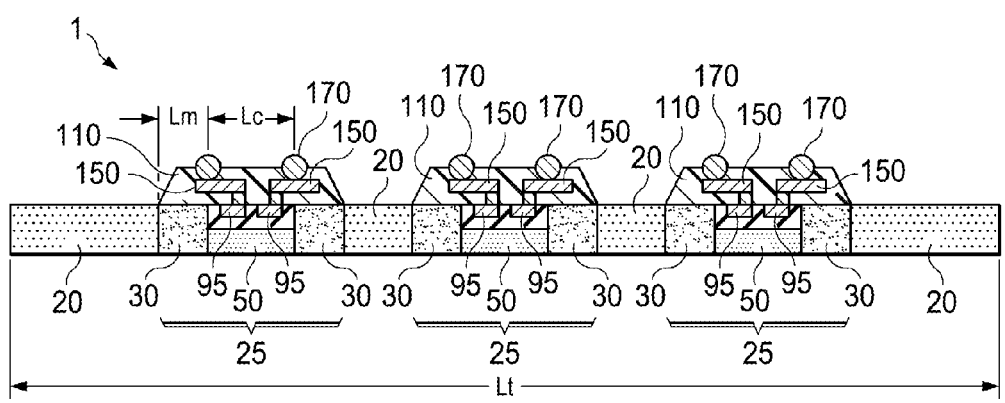
Figure 1C:
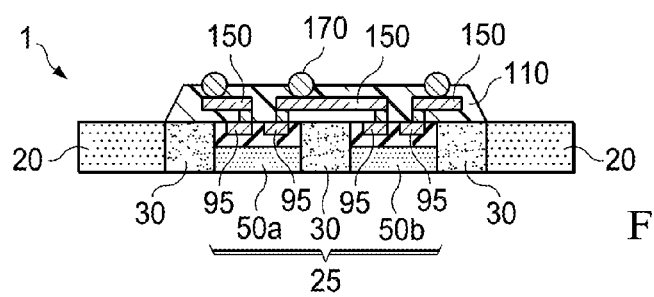

A structural embodiment of the invention showing a reconstituted wafer during the fabrication process will be first described using FIG. 1A-1C. A frame for fabricating a reconstituted wafer will be described in accordance with an embodiment of the invention using FIG. 2. Further structural embodiments of the frame will be described with respect to FIGS. 8A-8C and 9A-9B. A fabrication process for manufacturing the wafer level package will be described using FIGS. 3-7 in accordance with an embodiment of the invention. An alternative embodiment of the fabrication process will be described with respect to FIGS. 10A-10B.

FIGS. 1A-1C illustrate a reconstituted wafer before separation into individual integrated circuits after completion of wafer level packaging in accordance with an embodiment of the invention. FIG. 1A illustrates a top view while FIG. 1B illustrates a cross sectional view along line 1B of FIG. 1A and FIG. 1C illustrates a cross sectional view along line 1C of FIG. 1A.

Referring to FIG. 1A, a reconstituted wafer 1 comprises a frame 20 having openings 25. Chips 50 are disposed within the openings 25 and filled with a mold compound 30. The chips 50 consist of a front-side surface comprising active devices, transistors, interconnects and contact pads and a back-side surface consisting of bare silicon. The back-side silicon surface of the chips may be ground or etched back to a certain thickness. In some embodiments the back-side surface of the chips may be covered by a dielectric or even a conductive layer on top of the silicon. The chips 50 are disposed within the openings 25 face down with the front-side surface with the active devices, interconnects and pads in contact to the adhesive tape. Each opening 25 may comprise more than one chip. For example, FIG. 1A shows two chips; a first chip 50a and a second chip 50b, disposed together in some of the openings 25. In various embodiments, in fabricating system on chips, typically all openings are filled with multiple chips. For example, in one embodiment, the first chip 50a comprises a functional chip such as a processor while the second chip 50b comprises a memory component. Similarly, in various embodiments, analog, digital, high voltage, non-volatile chips can be placed within the openings 25. In various embodiments multiple chips can be placed within the openings 25. Similarly, in some embodiments, for example, while fabricating microprocessor chips, the openings may be filled with only a single chip.

FIG. 1B illustrates a cross sectional view and shows the chips 50 surrounded by the mold compound 30. Redistribution lines 150 are embedded in a first dielectric layer 110 and are coupled to pads 95 on the last metallization levels of the chips 50. The redistribution lines 150 are coupled to bump pads to which solder bumps 170 are attached.

As seen in FIGS. 1A and 1B, the fraction of mold compound 30 is dramatically lowered relative to the chips 50 compared to a conventional reconstituted wafer in which the mold compound rather than the frame is used to form much of the reconstituted wafer. In fact as shown in FIG. 1B, in various embodiments of the invention, the mold compound 30 has a lower volume fraction laterally compared to the chips 50 in the reconstituted wafer 1. For example, in FIG. 1B, the fraction of the mold compound 30 (Fm) along the line 1B-1B in FIG. 1A is about 6Lm/Lt, whereas the fraction of the chips 50 (Fc) along the line 1B-1B in FIG. 1A is about 3Lc/Lt. As the length of the mold compound is relatively small compared to the total length of the reconstituted wafer 1, the fraction of the mold compound 30 (Fm) is dramatically reduced. A reduced fraction of the mold compound (Fm) reduces the stress buildup during subsequent thermal processing. In various embodiments, the fraction of the mold compound 30 (Fm) is less than 0.5, and less than 0.1 in one embodiment.

Further, in various embodiments of the invention, the volume fraction of the mold compound 30 is lower than the volume fraction of the chips 50 in the reconstituted wafer 1. The volume fraction of the mold compound 30 is defined as the total volume of the mold compound 30 in the reconstituted wafer 1 divided by the total volume of the reconstituted wafer 1. Similarly, the volume fraction of the chips 50 is defined as the total volume of all the chips 50 in the reconstituted wafer 1 divided by the total volume of the reconstituted wafer 1. In various embodiments, the volume fraction of the mold compound 30 is less than 0.5, and less than 0.1 in one embodiment.

In various embodiments, the coefficient of thermal expansion of the frame 20 is about the same as the coefficient of thermal expansion of the chips 50. Hence, the frame 20, unlike the mold compound 30, does not exert any stress upon thermal cycling. In one embodiment, the frame comprises a same material as the chips 50. In other embodiments, the frame 20 comprises materials having similar coefficient of thermal expansion as the chips 50. In one embodiment, the coefficient of thermal expansion is about 0.5 times to about 2 times that of the chips 50.

FIG. 1C illustrates multiple chips disposed within a single opening of the frame 20 in accordance with an embodiment of the invention, and illustrates a cross sectional view along line 1C of FIG. 1A.

Referring to FIG. 1C, multiple chips 50a and 50b are disposed within an opening 25 of the frame 20. The openings have been filled with a mold compound thus separating the chips 50a and 50b. The chips 50a and 50b are coupled together through redistribution lines 150.

Figure 2:
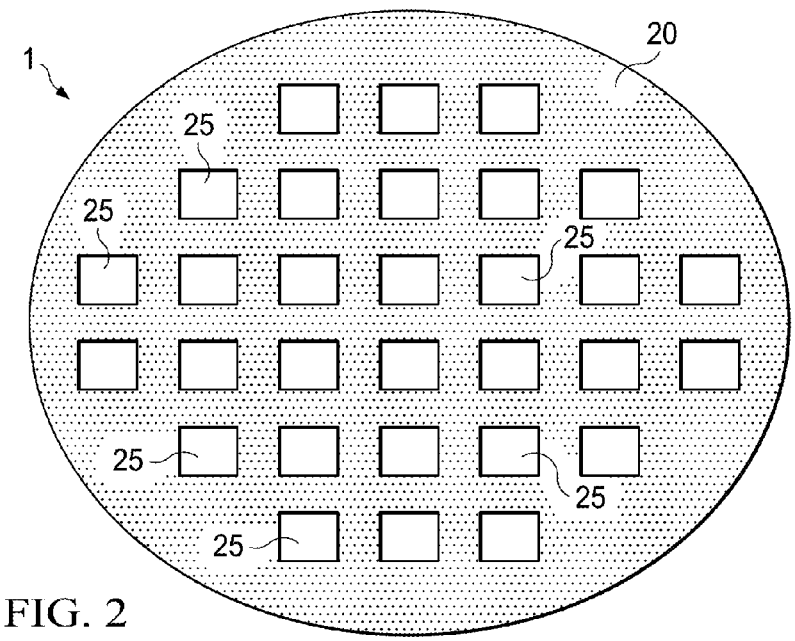
FIG. 2 illustrates a frame for fabricating a reconstituted wafer in accordance with an embodiment of the invention.

FIG. 2 illustrates a frame for fabricating a reconstituted wafer in accordance with an embodiment of the invention.

The frame 20 comprises a plurality of openings 25 having a predetermined separation between each opening 25. In various embodiments, frames of different opening sizes and different separations may be used for different types of chips. The frame 20 is developed specifically for each chip designed, prior to its manufacturing. The frame 20 for each chip design is developed based on the size of the chip and the process technology flow. In some embodiments, different chips having different designs may use a common frame if the chip sizes are similar. For example, chips may be classified into different classes based on the chip size, and a frame 20 may be designed for all chips in each class.

In various embodiments, the total number of openings 25 in the frame 20 is about the same as the total number of chips in the wafer after the end of back end processing. In some embodiments, to reduce the size of the reconstituted wafer 1 (e.g., so as to enable manufacturing too compatibility), the numbers of openings 25 in the frame 20 may be less than the total number of chips 50 in the wafer.

The total number of openings 25 in the frame 20 depends on the wafer technology and the size of the chips. In addition, the total number of openings 25 and the size of the openings 25 in the frame 20 depends also on the number of bump pads or I/O connections required in the fan-out area over the mold. For example, a frame 20 for a 300 mm technology may comprise about 50 to about 1000 openings depending on the size of the chips and the I/O requirements (i.e., number of bump pads) of the respective product. Similarly, for example, a frame 20 for a 200 mm technology may comprise about 20 to about 500 openings depending on the size of the chips.

The openings 25 are arranged in a pattern within the frame 20 and may be of equal size in one embodiment. The predetermined separation between the openings 25 is larger than the separation between the chips 50 on a silicon wafer. In various embodiments, the separation between the openings 25 is about 0.5 mm to about 5 mm. In various embodiments, the separation between the openings 25 is about 0.2% to about 5% of the diameter of the wafer.

In FIG. 2, the frame comprises singulated die openings in the form of a wafer. In various embodiments, any other forms of the frame (e.g., rectangular panels) and/or the openings (e.g., circular openings) may be used.

In various embodiments, the frame 20 may comprise multiple layers such as a silicon substrate with a top coating of another material such as silicon dioxide. In one embodiment, the frame 20 comprises silicon. Alternatively, the frame 20 can be made from other materials with coefficient of thermal expansion that is comparable to silicon. In some embodiments, the frame 20 may comprise other semiconductor materials. Examples include SiC, InP, GaAs, tungsten, molybdenum, hafnium, zirconia, zirconium carbide, aluminum oxide, aluminum nitride, alumina, alumino silicate glass, quartz, borosilicate glass, and combinations thereof.

FIGS. 3-7 illustrate an embodiment of fabricating the wafer level package in various stages of manufacturing.

Figure 3A:
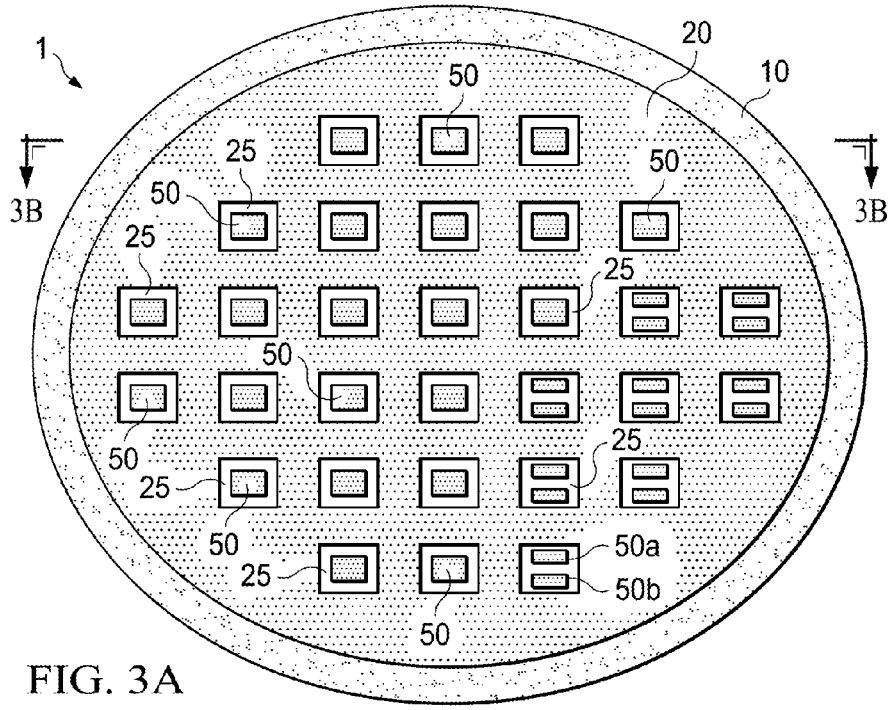
Figure 3B:
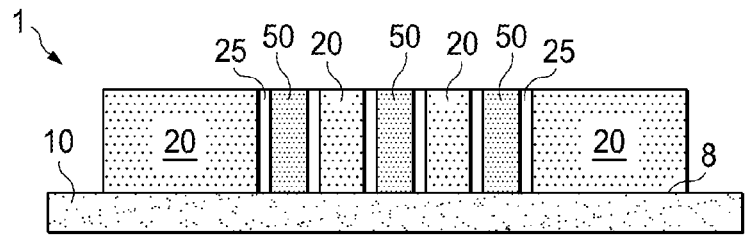
Figure 4A:
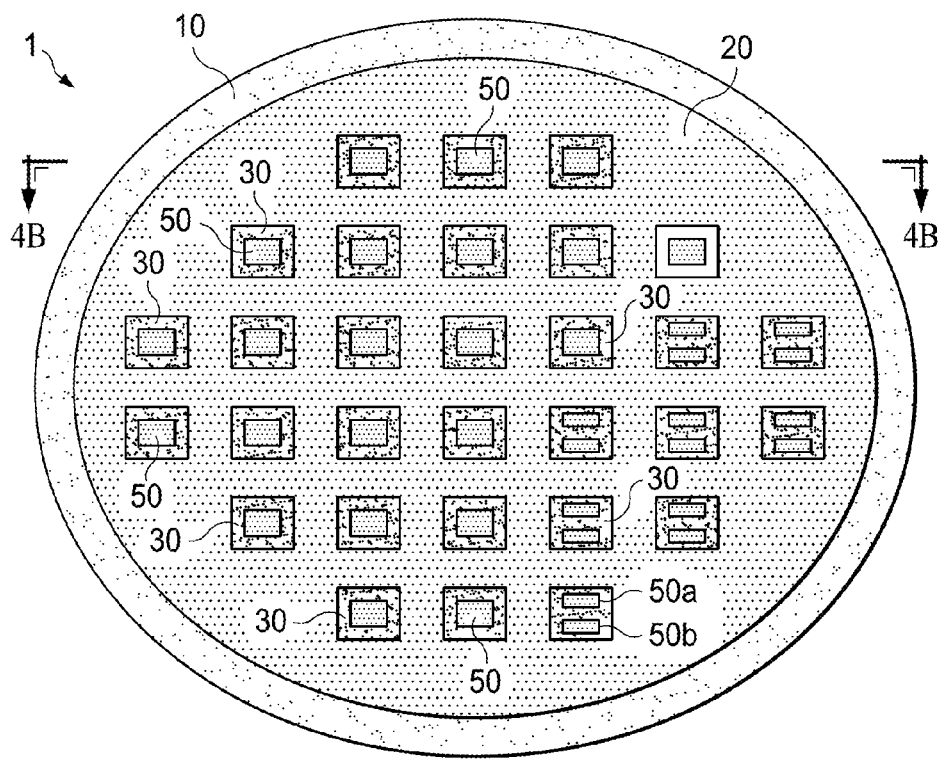

FIGS. 3A and 4A illustrate top views, and FIGS. 3B, 4B, and 5-7 illustrate cross sectional views during the fabrication.

Referring to FIGS. 3A and 3B, the frame 20 is placed on an adhesive tape 10 which may be placed on a carrier. A bottom surface 8 (FIG. 3B) of the frame 20 is placed on the adhesive tape 10. The chips 50 are then placed within the openings 25 of the frame 20. The chips 50 are placed such that the active devices and the contact pads for the redistribution lines on the chips are about coplanar or slightly recessed to the bottom surface 8 of the frame 20. As illustrated in FIG. 3A, multiple chips may be placed within a single opening 25 in various embodiments. In various embodiments, the chips 50 are stationary while the frame 20 is moving when placing the chips 50 within the frame 20. Alternatively, in some embodiments, the chips 50 may be moved and placed into a stationary frame 20. Similarly, in the illustrated embodiment, only the chips 50 are placed within the openings 20. However, in alternative embodiments using different types of packaging technologies, additional packaging layers or substrates may be placed within the openings 20. For example, a substrate for the chips 50 may be placed within each of the openings 20 in some embodiments. In such embodiments, the substrate may comprise suitable means/materials for electrical or thermal conduction.

Figure 4B:
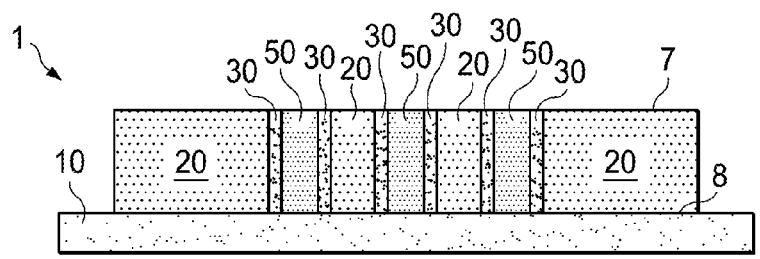

Referring to FIGS. 4A and 4B, the unfilled opening around the chips 50 is filled with a mold compound 30. In various embodiments, the mold compound 30 is deposited by any suitable technique including spin-on coating, spraying or printing.

After deposition of the mold compound 30, any excess mold on the top surface 7 of the frame should be removed by wiping, scraping, or other planarization process. However, in various embodiments, it is important that during this process, the frame stays intact and is not thinned or modified in any case. Subsequently, the mold is subjected to a curing process thereby forming the reconstituted wafer 1.

Alternatively, the mold may be cured first followed by a planarization of the excess mold, e.g., by chemical mechanical polishing (CMP) or an etchback process. Again, in various embodiments, the frame 20 is not thinned or modified during the CMP or the etch process.

The tape 10 is removed after forming the reconstituted wafer 1. In various embodiments, the tape 10 may be mechanically peeled off or removed by heating the tape 10 to a temperature where the adhesive on the surface of the tape 10 loses its adhesiveness.

The reconstituted wafer 1 thus formed can be processed as a regular wafer as in conventional processing. In various embodiments, a wafer level processing is used although in alternate embodiments, other packaging technologies may be used to form the contacts.

Similar to the fan-out WLP, the reconstituted wafer 1 includes a larger separation between individual chips 50 and includes a region of the mold compound 30 surrounding each of the chips 50. Hence, contacts can be made over the mold compound 30 and/or over the chips 50, thus having all the advantages of contact formation in the fan-out WLP. Alternatively, the reconstituted wafer 1 may be formed as different shape, e.g., as a rectangle which would be more efficient in surface area. However, a non-circular shape may not be compatible with existing equipment.

Figure 5:
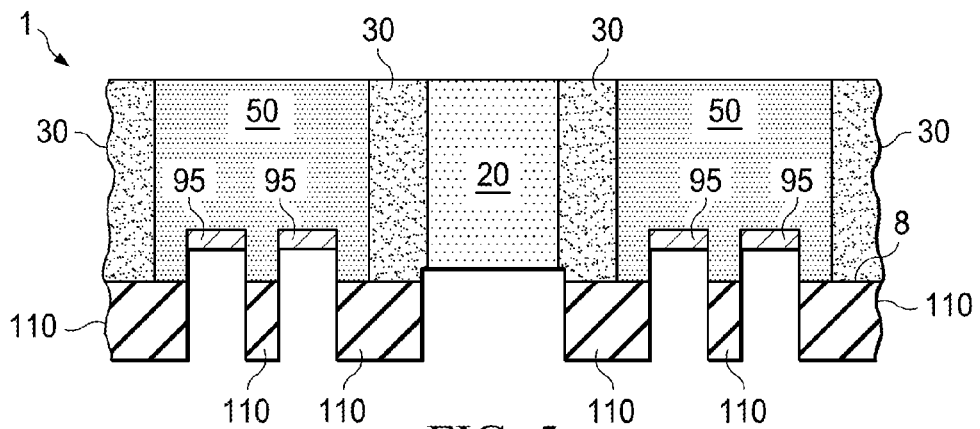
FIG. 5 illustrates a cross-sectional view of an embodiment of fabricating the wafer level package during a next stage of manufacturing.
Figure 6:
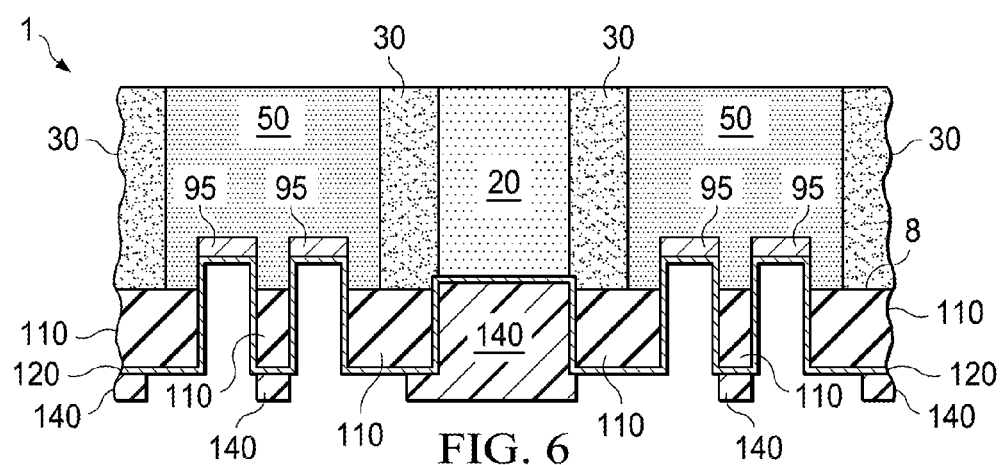
FIG. 6 illustrates a cross-sectional view of an embodiment of fabricating the wafer level package during a next stage of manufacturing.
Figure 7:
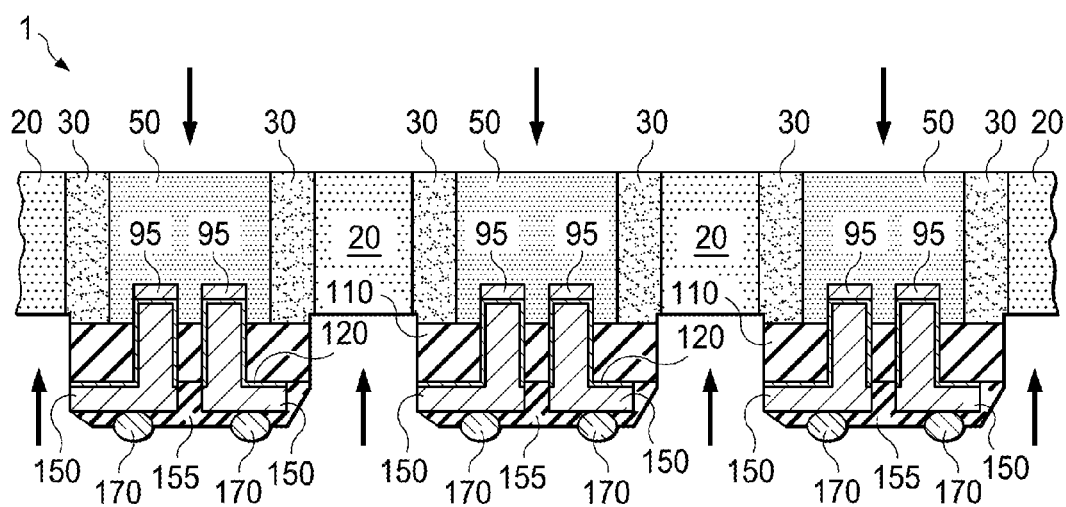
FIG. 7 illustrates a cross-sectional view of an embodiment of fabricating the wafer level package during a next stage of manufacturing.

FIG. 5 illustrates a cross sectional view of adjacent chips within the reconstituted wafer 1 during wafer level packaging. FIGS. 5-7 illustrate cross sectional views of only a few chips, but the WLP process applies uniformly across the reconstituted wafer 1.

In alternative embodiments, the reconstituted wafer 1 may be processed using other packaging technologies. For example, in one embodiment, the chips 50 and the mold compound 50 may be separated from the frame 20 and subsequent processing continues using alternative packaging techniques such as wire bonding.

Referring to the cross sectional view of FIG. 5, the chips 50 are separated by a portion of the frame 20, and surrounded by mold compound 30. A first dielectric layer 110 is formed and patterned for redistribution lines.

The first dielectric layer 110 is formed over the exposed bottom surface 8 of the reconstituted wafer 1. In various embodiments, the first dielectric 110 is coated, for example, by a spin-on process or applied using a chemical vapor deposition process. In various embodiments, the first dielectric layer 110 comprises organic polymer, BCB, polyimide, photoimide or inorganic dielectric.

In some embodiments, the first dielectric layer 110 is also photosensitive and can be directly exposed using photolithography. Examples of photosensitive first dielectric layer 110 include photosensitive polyimides that can be directly developed. In this case of a photosensitive dielectric, the dielectric can be patterned by lithography exposure and development in a way that the contact or bond pads on the chip and the frame can be opened in one single photo step. This means that the first dielectric layer 110 is removed over the contact or bond pads on the chip and on the frame area as well.

In case of a non-photosensitive polyimide, a photo resist is deposited. Using a photolithography process, the first dielectric layer 110 is patterned to open the bond pads 95 and the frame area.

In various embodiments, the first dielectric layer 110 is not deposited over the frame 20. Alternatively, the first dielectric layer 110 is deposited and removed using a lithography step. In various embodiments, first dielectric layer 110 is removed using a same lithographic step as the patterning step for opening the bond pads 95. For example, the photosensitive first dielectric layer 110 over the frame is removed at the same time as forming the pattern that opens the bond pads 95.

In other embodiments, the first dielectric 110 may be removed together with the second dielectric layer 155 (formed in FIG. 7) using a common etching process after finishing all wafer level packaging steps. Hence, as shown in FIG. 5, the first dielectric layer 110 is disposed only over the chips 50 and the mold compound 30.

Referring to FIG. 6, a metallic liner 120 is optionally deposited over the complete reconstituted wafer (i.e., over the chip area on top of the dielectric 110 and directly over the frame without dielectric 110). In various embodiments, the metallic liner 120 is deposited using a deposition process to form a conformal or nearly conformal layer comprising Ti, Ta, Ru, W, combinations thereof, or a nitride, silicide, or carbide thereof. Examples of such combinations include TiN, TaN, WN, and TiW. In various embodiments, the metallic liner 120 is deposited using a chemical vapor deposition, plasma vapor deposition, sputtering process or atomic layer deposition. In various embodiments, the metallic liner 120 comprises a thickness of about 20 nm to about 200 nm. The metallic liner 120 is a diffusion barrier metal between the on-chip bond pad and the subsequent redistribution layer and prevents out-diffusion of copper from the last metal line as well as any intermixing with further metallic layers.

A further metallic seed layer is deposited in some embodiments. The metallic seed layer covers the metallic liner 120. In various embodiments, the metallic seed layer is deposited using a deposition process to form a conformal or nearly conformal layer. In various embodiments, the metallic seed layer is deposited using a chemical vapor deposition, plasma vapor deposition, sputtering process or atomic layer deposition. In various embodiments, the metallic seed layer comprises a thickness of about 20 nm to about 200 nm. The metallic seed layer provides the seed layer for the growth during the electroplating process. In various embodiments, the metallic seed layer comprises copper or other metals like Al, W, Ag, Au, Ni or Pd.

As illustrated in FIG. 6, a thick photo resist layer 140 is deposited. In various embodiments, the photo resist layer is several microns thick, and varies from about 1 μm to about 10 μm, in one embodiment. The photo resist layer 140 is exposed and developed. The patterned photo resist layer 140 comprises patterns for redistribution metal lines, pad vias and bump pads.

As illustrated in FIG. 7, a redistribution layer comprising redistribution metal lines 150 and contact pads are formed by depositing a fill metal over the metallic liner 120. The redistribution layer may be deposited by electroplating, sputtering, or deposited by any other suitable process.

In various embodiments, the fill metal of the redistribution layer comprises copper, although in some embodiments, other suitable conductors are used. The metallic liner and seed layer 120 comprises a same material as the material of the subsequent metal lines to enable electroplating, in one embodiment.

In various embodiments, the redistribution metal line 150 comprises multiple layers, for example, Cu/Ni, Cu/Ni/Pd/Au, Cu/NiMoP/Pd/Au, or Cu/Sn, in one embodiment. In one embodiment, the redistribution metal line 150 comprises a Ti/Cu/Ni layer.

The patterned photo resist layer 140 is stripped to expose the metallic liner and seed layer 120. The exposed metallic liner and seed layer 120 is next etched away, using, for example, a wet etch chemistry. A second dielectric layer 155 is deposited. In various embodiments, the second dielectric layer 155 is coated, for example, by a spin-on process or applied using a chemical vapor deposition process. In various embodiments, the second dielectric layer 155 comprises organic polymer, BCB, polyimide, photoimide or inorganic dielectric.

The second dielectric layer 155 is patterned to open contact pads 95 and the frame 20. As described in prior steps, no second dielectric layer 155 remains over the frame 20. In some embodiments, a tapered sidewall of the dielectric films may be formed at the edges of the reconfigured dies (edge of mold compound 30 surrounding the chips 50) close to the frame interface.

A bump metal (not shown) is deposited over the exposed contact pads or bump pads on the redistribution layer. The bump metal is preferably placed on to the bump pads in the form of a solder ball. The bump metal is alternatively electroplated onto a seed layer on the redistribution layer, although in other embodiments, other processes such as electroless plating or deposition processes such as vapor deposition may also be used. The bump metal may be a single layer or comprise multiple layers with different compositions. For example, in one embodiment, the bump metal comprises a lead (Pb) layer followed by a tin (Sn) layer. In another embodiment, an Sn/Ag layer may be deposited as the bump metal. Other examples include SnPbAg, SnPb, PbAg, PbIn, and lead free materials such as SnBi, SnAgCu, SnTn, and SiZn. In various embodiments, other suitable materials may be deposited.

The substrate is heated to reflow the bump metal and the heating forms a solder bump 170 over the contact pads 95 on the redistribution layer. After reflow, a homogeneous solder bump 170 is formed. For example, in the embodiment when a Pb/Sb layer is deposited, after reflow, high lead alloys including 95 Pb/5 Sn (95/5) or 90 Pb/10 Sn (95/10) with melting temperatures in excess of 300° C. are formed. In a different embodiment, eutectic 63 Pb/37 Sn (63/37) with a melting temperature of 183° C. is formed. Similarly, a lead free solder bump may be formed that comprises a composition of 97.5 Sn/2.6 Ag (97.5/2.5). Other lead free solder mixtures of Sn and Ag or Sn, Ag and Cu may be used in different embodiments. The solder bump 170 comprises a homogeneous material and has a well defined melting temperature. For example, the high melting Pb/Sn alloys are reliable bump metallurgies which are particularly resistant to material fatigue.

As illustrated in FIG. 7, after finishing all wafer level packaging steps, the finished dies are separated from the frame 20. After this stage of processing, each die comprises the chip 50, the mold compound 30, the redistribution layer (e.g., redistribution lines 150), and the solder bumps 170.

In one embodiment, the frame 20 is separated from the dies by pushing the finished dies from the frame. Advantageously, in various embodiments, the frame 20 is relatively unchanged during the processing. Hence, after removing the finished dies, and after an inspection and optional cleaning process, the frame 20 is reused for processing as described above.

Figure 8A:
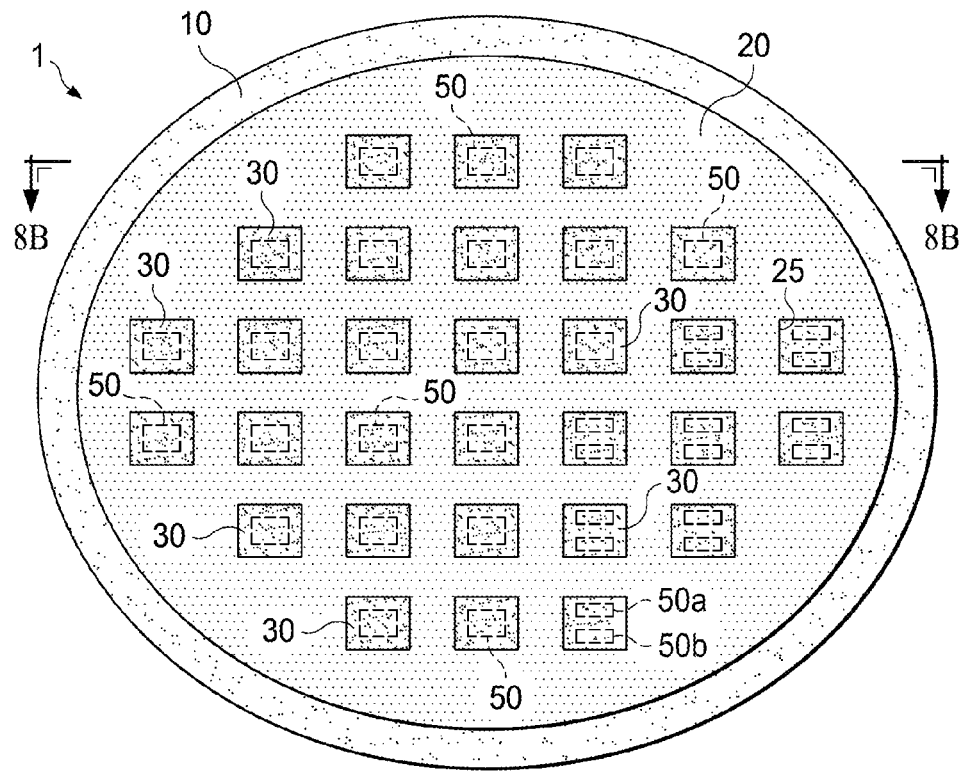
Figure 8B:
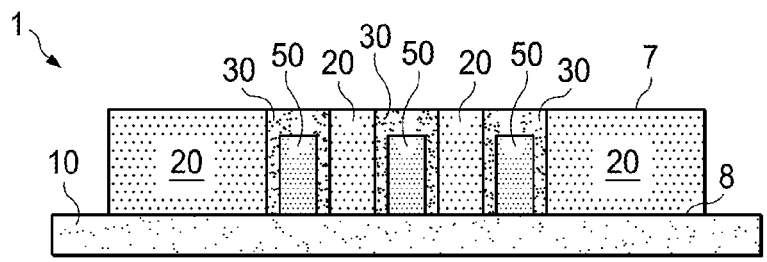
Figure 8C:
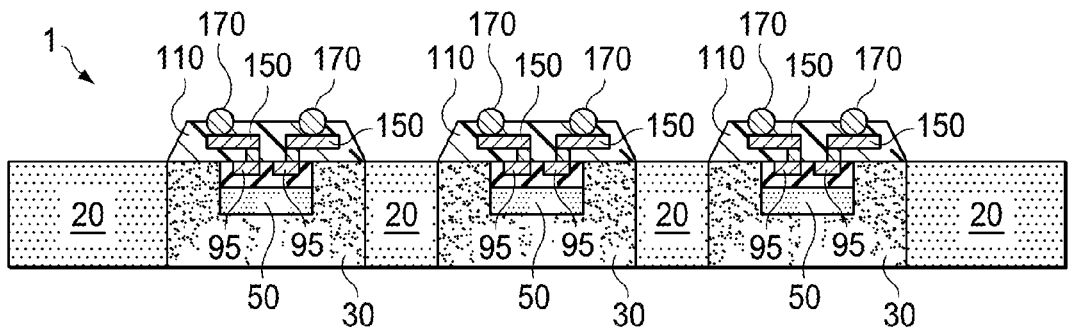

FIGS. 8A-8C illustrate a reconstituted wafer before separation into dies in accordance with an embodiment of the invention. FIG. 8A illustrates a top view while FIG. 8B illustrates a corresponding cross sectional view during an intermediate stage of fabrication using the wafer level packaging. In terms of manufacturing, FIGS. 8A and 8B correspond to a same stage of fabrication as described with respect to FIG. 4. FIG. 8C illustrates the reconstituted wafer after completion of wafer level packaging.

Similar to the embodiment described with respect to FIG. 1A, a reconstituted wafer 1 comprises a frame 20 having openings 25. Chips 50 are disposed within the openings 25 and filled with a mold compound 30. However, in this embodiment, frame 20 is thicker than the chips 50. Hence, as illustrated in FIG. 8B, the mold compound 30 covers the backside of the chips 50. Advantageously, the chips 50 are not exposed on the top surface 7 of the frame 20, and hence, additional protective layers are not required to protect the chips 50.

FIG. 8C illustrates a cross sectional view of the wafer level package after completion of the WLP processes.

Referring to FIG. 8C, the chips 50 are surrounded by the mold compound 30. Redistribution lines 150 are embedded in a first dielectric layer 110 and are coupled to pads 95 on the last metallization levels of the chips 50. The redistribution lines 150 are coupled to bump pads to which solder bumps 170 are attached.

As illustrated in FIG. 8C, the mold compound 30 forms a protective layer under the chip 50. The thick frame 20 also provides better mechanical support and is likely to have a longer life time (e.g., due to its better mechanical reliability), and hence more amenable to repeated processing.

Figure 9A:
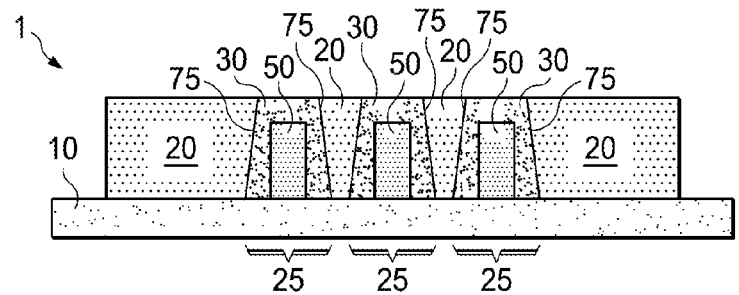
FIGS. 9A and 9B illustrate a cross sectional view of a reconstituted wafer during processing in accordance with embodiments of the invention.
Figure 9B:
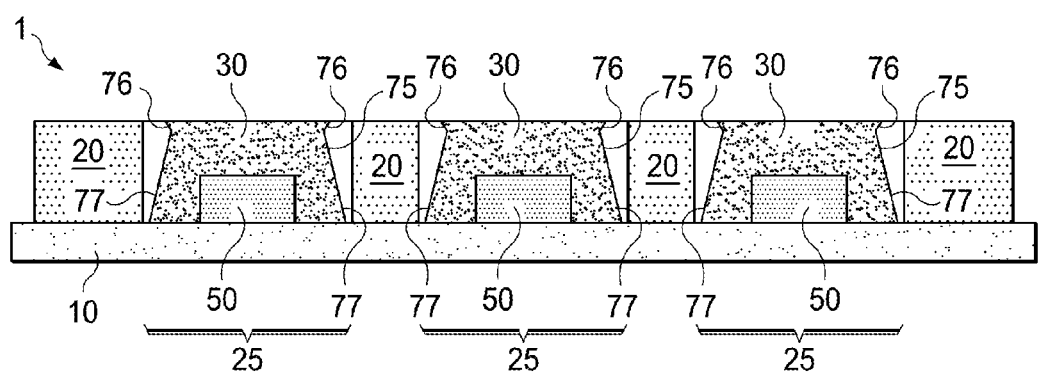

FIGS. 9A and 9B, illustrates a cross sectional view of a reconstituted wafer before separation into dies after completion of wafer level packaging in accordance with embodiments of the invention. FIGS. 9A-9B show the wafer before the adhesive tape 10 is removed and corresponds to the same stage of fabrication as described with respect to FIG. 4B.

Referring to FIG. 9A, the openings 25 on the frame 20 comprise tapered sidewalls 75 to facilitate easy removal of the finished dies from the frame 20 after completion of all wafer level processing (e.g., redistribution layer and solder ball processing as described above).

FIG. 9B illustrates an alternative embodiment wherein the sidewalls 75 of the openings 25 of the frame 20 include a first and a second tapered portion 76 and 77. The first tapered portion 76 enables better adhesion, and hence provides ease of use during wafer level processing. After processing, the finished dies can be removed easily due to the second taper 77.

Figure 10A:
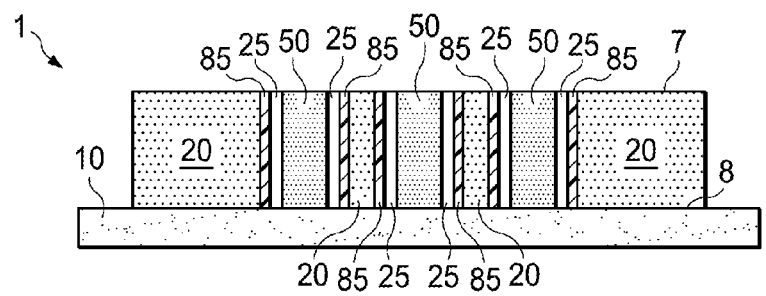
FIGS. 10A and 10B illustrate a cross sectional view of a reconstituted wafer during fabrication in accordance with embodiments of the invention.
Figure 10B:
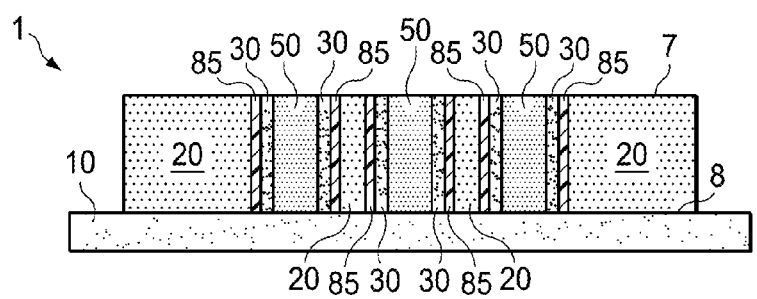

FIGS. 10A and 10B illustrate a cross sectional view of a reconstituted wafer during fabrication in accordance with embodiments of the invention. FIG. 10A illustrates a cross sectional view before filling in the mold compound, whereas FIG. 10B shows the wafer before the adhesive tape 10 is removed and corresponds to the same stage of fabrication as described with respect to FIG. 4B.

The fabrication process follows the prior embodiments and uses the frame 20 as described with respect to FIG. 2. Referring to FIG. 10A, the frame 20 is placed on an adhesive tape 10 which may be placed on a carrier. A bottom surface 8 of the frame 20 is placed on the adhesive tape 10. The chips 50 are then placed within the openings 25 of the frame 20 as described with respect to FIGS. 3A and 3B.

After placing the chips 50, a poor adhesion layer 85 is deposited on the sidewalls of the openings 25. In various embodiments, the poor adhesion layer 85 is coated onto the sidewalls of the openings 25. In some embodiments, the poor adhesion layer 85 may be formed only on some edges or sidewalls of the openings 25. In various embodiments, the poor adhesion layer 85 may also cover the top surface of the frame 20.

The poor adhesion layer 85 comprises a material that does not strongly adhere to the frame 20. Hence, after completion of processing, the poor adhesion layer 85 enhances the ease of removal or separation of finished dies from the frame 20. Relative to using the mold compound 30, the poor adhesion layer 85 easily peels off or cracks; making it easier to separate the finished dies from the frame 20, and minimizes any potential damage to the frame 20. In various embodiments, the poor adhesion layer 85 has better adhesion to the frame 20 than to the mold compound 30. Hence, after separation, most of the poor adhesion layer 85 is still disposed on the frame 20 and can be cleaned, e.g., using a wet chemical etch process. Any suitable material can be used as the poor adhesion layer 85, including low-k materials, organic polymer, benzo-cyclo-butene (BCB), polyimide, inorganic dielectric, etc. Similarly, polyimide films having a different composition than the mold compound 30 may be used in an embodiment. The thickness of the poor adhesion layer 85 may be controlled to avoid mechanical separation of the chips 50 before completion of the processing.

As shown in FIG. 10B, a mold compound fills the remaining opening between the chips 50 and the poor adhesion layer 85. Further processing proceeds as described above, for example, with respect to FIGS. 4-7.

Figure 11A:
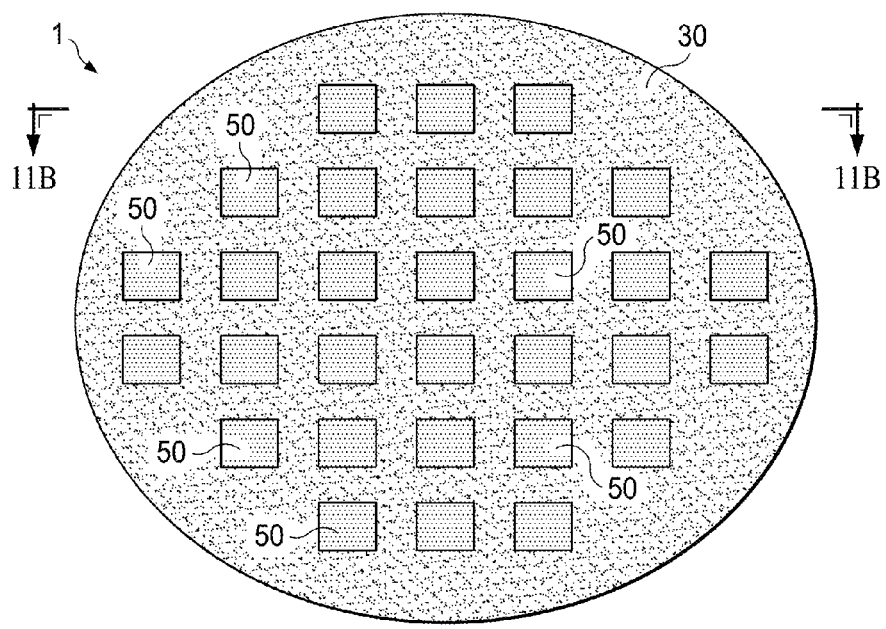
Figure 11B:
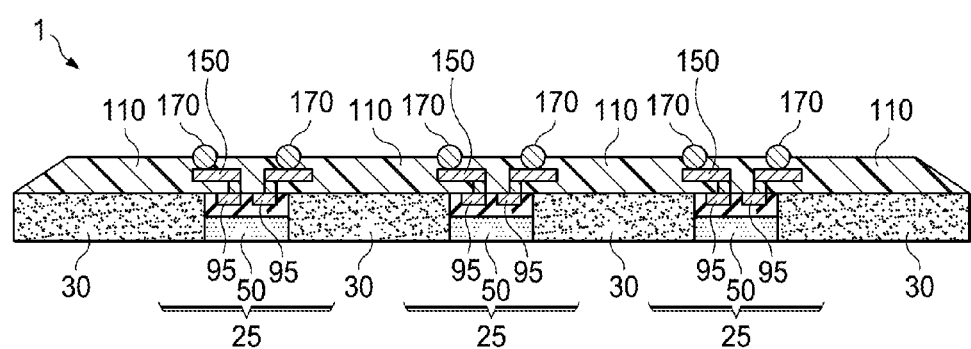

FIGS. 11A and 11B illustrate a ball grid array package illustrating a prior art reconstituted wafer before separation into individual integrated circuits after completion of processing, wherein FIG. 11A illustrates a top view and FIG. 11B illustrates a cross sectional view along line 11B of FIG. 11A.

Referring to FIGS. 11A and 11B, a reconstituted wafer 1 has chips 50 surrounded by a mold compound 30. FIG. 11B illustrates the redistribution lines 150 coupled to pads 95 on the last metallization levels of the chips 50. The redistribution lines 150 are coupled to bump pads to which solder bumps 170 are attached. Unlike embodiments of the invention, the redistribution lines 150 are embedded in a continuous first dielectric layer 110 disposed over the mold compound 30.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
   providing chips comprising a first chip and a second chip;
   placing the chips in a frame having a plurality of openings, wherein the first and the second chips are placed in a same opening of the plurality of openings, wherein the first and the second chips in the opening are separated from another chip placed with an adjacent opening of the plurality of openings by a portion of the frame;
   forming a reconstituted wafer by filling a mold compound into the plurality of openings, the mold compound being formed around and between the first and the second chips;
   forming a finished die comprising the first and the second chips, wherein the first and the second chips are coupled together through a conductive layer; and
   separating the finished die from the frame.

2. The method of claim 1, further comprising placing the frame on an adhesive tape, a first surface of the chips having active devices disposed on the adhesive tape.

3. The method of claim 2, wherein the plurality of openings have tapered sidewalls, wherein the plurality of openings have a larger diameter at a bottom surface adjacent the adhesive tape than at a distance about midway between an opposite top surface of the frame and the bottom surface.

4. The method of claim 1, wherein the frame comprises a material having a coefficient of thermal expansion about the same as the coefficient of thermal expansion of the chips.

5. The method of claim 1, wherein the first and the second chips are coupled together using wafer level packaging.

6. The method of claim 1, further comprising discarding the frame after separating the finished dies from the frame.

7. The method of claim 1, wherein separating the finished die from the frame comprising the finished die from the frame without damaging the frame.

8. A semiconductor device formed by the method of claim 1.

9. A method of fabricating a semiconductor device, the method comprising:
   providing a reusable frame comprising a plurality of openings;
   placing a first chip and a second chip in an opening of the plurality of openings, wherein the first chip and the second chip in the opening are separated from another chip placed with an adjacent opening of the plurality of openings by a portion of the reusable frame;

filling a mold compound into the plurality of openings, the mold compound being formed around and between the first and the second chips;

forming a finished die comprising the first and the second chips; and separating the finished die from the frame while keeping the frame intact.

10. The method of claim 9, further comprising dicing a first semiconductor wafer to form the first chip and dicing a second semiconductor wafer to form the second chip.

11. The method of claim 9, further comprising coupling the first chip with the second chip through a conductive layer.

12. The method of claim 9, wherein the frame comprises a silicon substrate.

13. The method of claim 9, further comprising placing the frame on an adhesive tape, a first surface of the chips having active devices disposed on the adhesive tape.

14. The method of claim 13, wherein the plurality of openings have tapered sidewalls, wherein the plurality of openings have a larger diameter at a bottom surface adjacent the adhesive tape than at a distance about midway between an opposite top surface of the frame and the bottom surface.

15. The method of claim 9, wherein the frame comprises a material having a coefficient of thermal expansion about the same as the coefficient of thermal expansion of the first and the second chips.

16. A frame comprising:

a cylindrical silicon substrate having a diameter of at least 200 mm; and a plurality of openings disposed within the silicon substrate, wherein the plurality of openings has tapered sidewalls, wherein the plurality of openings are arranged in a plurality of rows and columns, wherein a number of openings along a row has a maximum for a central row aligned along the diameter, wherein each of the plurality of openings is separated by a portion of the frame, wherein all the plurality of openings have about the same shape and size.

17. The frame of claim 16, wherein a number of openings along a column has a maximum for a central column aligned along the diameter, wherein the number of openings along the central row is the same as the number of openings along the central column.

18. The frame of claim 16, wherein the plurality of openings is configured to hold a first type of semiconductor chip and a second type of semiconductor chip in a same opening of the plurality of openings.

19. The frame of claim 16, wherein the plurality of openings have a larger diameter at a bottom surface than at a distance about midway between an opposite top surface of the frame and the bottom surface.

20. A method of fabricating a semiconductor device, the method comprising:

providing chips comprising a first chip and a second chip;

placing the chips in a frame having a plurality of openings, wherein the first and the second chips are placed in a same opening of the plurality of openings, wherein the frame comprises a bottom surface and an opposite top surface, wherein the plurality of openings has tapered sidewalls, wherein a diameter of a particular opening of the plurality of openings at the bottom surface is different from a diameter of that particular opening at the top surface;

forming a reconstituted wafer by filling a mold compound into the plurality of openings, the mold compound being formed around and between the first and the second chips;

forming a finished die comprising the first and the second chips, wherein the first and the second chips are coupled together through a conductive layer; and separating the finished die from the frame.

21. The method of claim 20, wherein the plurality of openings has a larger diameter at a bottom surface than at a distance about midway between an opposite top surface of the frame and the bottom surface.

22. A method of fabricating a semiconductor device, the method comprising:

providing a reusable frame comprising a plurality of openings, wherein the plurality of openings has tapered sidewalls, wherein the reusable frame comprises a bottom surface and an opposite top surface, and wherein a diameter of a particular opening of the plurality of openings at the bottom surface is different from a diameter of that particular opening at the top surface;

placing a first chip and a second chip in an opening of the plurality of openings;

filling a mold compound into the plurality of openings, the mold compound being formed around and between the first and the second chips;

forming a finished die comprising the first and the second chips; and separating the finished die from the frame while keeping the frame intact.

23. The method of claim 22, wherein the plurality of openings has a larger diameter at the bottom surface than at a distance about midway between the top surface and the bottom surface.

* * * * *